(12) United States Patent
Kitamura et al.

(10) Patent No.: US 6,852,608 B2
(45) Date of Patent: Feb. 8, 2005

(54) PRODUCTION METHOD FOR SEMICONDUCTOR CHIP

(75) Inventors: Masahiko Kitamura, Tokyo (JP); Koichi Yajima, Tokyo (JP); Yusuke Kimura, Tokyo (JP); Tomotaka Tabuchi, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 10/250,916

(22) PCT Filed: Nov. 15, 2002

(86) PCT No.: PCT/JP02/11941
§ 371 (c)(1),
(2), (4) Date: Jul. 8, 2003

(87) PCT Pub. No.: WO03/049164
PCT Pub. Date: Jun. 12, 2003

(65) Prior Publication Data
US 2004/0048419 A1 Mar. 11, 2004

(30) Foreign Application Priority Data
Nov. 30, 2001 (JP) .................................... 2001-366858

(51) Int. Cl.$^7$ ............................................. H01L 21/301
(52) U.S. Cl. ................... 438/464; 438/460; 438/461; 438/462; 438/463; 438/977
(58) Field of Search ................ 438/460–464, 438/977

(56) References Cited

U.S. PATENT DOCUMENTS 5,641,714 A 6/1997 Yamanaka
5,981,361 A * 11/1999 Yamada ................. 438/464

FOREIGN PATENT DOCUMENTS

| EP | 1 107 299 | 6/2001 |
| JP | 63-256360 | 10/1988 |
| JP | 5-29455 | 2/1993 |
| JP | 5-62952 | 3/1993 |
| JP | 9-148283 | 6/1997 |
| JP | 2001-156027 | 6/2001 |
| JP | 2001-203255 | 7/2001 |

* cited by examiner

Primary Examiner—Carl Whitehead, Jr.
Assistant Examiner—Nema Berezny
(74) Attorney, Agent, or Firm—Wenderoth, Lind & Ponack, L.L.P.

(57) ABSTRACT

A semiconductor wafer is applied to a support disk via an intervening adhesive layer with the front side of the semiconductor wafer facing the adhesive layer, which is sensitive to a certain exterior factor for reducing its adhesive force; the semiconductor wafer is ground on the rear side; the wafer-and-support combination is applied to a dicing adhesive tape with the so ground rear side facing the dicing adhesive tape, which is surrounded and supported by the circumference by a dicing frame; the certain exterior factor is effected on the intervening adhesive layer to reduce its adhesive force; and the intervening adhesive layer and support disk are removed from the semiconductor wafer or chips without the possibility of damaging the same.

15 Claims, 11 Drawing Sheets

Ultraviolet rays

PRODUCTION METHOD FOR SEMICONDUCTOR CHIP

TECHNICAL FIELD

The present invention relates to a method for manufacturing semiconductor chips in which a support disk is used to hold fixedly a semiconductor wafer while dicing it into chips.

BACKGROUND ART

As is well known, a semiconductor wafer has a plurality of ICs or LSIs formed on its front side, and it is separated in the form of chips by dicing the semiconductor wafer along its crossing streets, so that they may be used in a variety of electronic apparatuses.

Semiconductor wafers have been ground away on the rear sides until their thickness is reduced to be 100 or less $\mu$m or 50 or less $\mu$m thick these days. Such thin wafers are difficult to be handled because of their softness like paper. As a remedy, therefore, they are stuck to support disks of good rigidity, thereby facilitating the grounding and transporting of such thin objects.

After grinding semiconductor wafers to be as thin as required, their support disks are removed from the semiconductor wafers, and then adhesive tapes are applied to the so ground semiconductor wafers for dicing. The semiconductor wafers, however, are so thin that it is very difficult to remove the adhesive tapes after being diced.

Alternatively the semiconductor wafers are grooved on the front sides along crossing streets, and the so grooved semiconductor wafers are ground on the rear sides until the grooves appear to separate each wafer into squares (commonly called "pre-dicing method"). As is known, such grooved semiconductor wafers are stuck to support disks of good rigidity before dicing, and they are removed from the support disks after dicing. It is, however, very difficult to remove the thin semiconductor chips from the support disks without damage.

What is aimed at the method for manufacturing chips by the present invention, therefore, is to permit semiconductor wafers or semiconductor chips to be removed from the support disks without being broken or damaged.

DISCLOSURE OF INVENTION

The present invention provides a method for dividing a semiconductor wafer into separate chips, said semiconductor wafer having a plurality of chips defined by crossing streets on its front side, characterized in that it comprises the steps of: applying the semiconductor wafer to a support disk via an intervening adhesive layer with the front side of the semiconductor wafer facing the adhesive layer, which is sensitive to a certain exterior factor for reducing its adhesive force (wafer-and-support combining step); holding fixedly the wafer-and-support combination on a selected chuck table of a wafer grinding machine to grind the semiconductor wafer on the rear side (grinding step); applying the wafer-and-support combination to an adhesive tape for dicing with the so ground rear side facing the adhesive tape, which tape is surrounded and supported by the circumference by a dicing frame (taping step); effecting the certain exterior factor on the intervening adhesive layer to reduce its adhesive force before or after the taping step, and removing the intervening adhesive layer and support disk from the front side of the semiconductor wafer after the taping step (tape-removing step); and holding the wafer-and-frame combination on the chuck table of a dicing machine to cut and separate the semiconductor wafer into individual chips (dicing step).

Also, the present invention provides a method for dividing a semiconductor wafer into separate chips, said semiconductor wafer having a plurality of chips defined by crossing streets on its front side, characterized in that it comprises the steps of: holding the semiconductor wafer on a chuck table of a dicing machine to make grooves along the crossing streets on the front side of the semiconductor wafer (grooving step); applying the semiconductor wafer to a support disk via an intervening adhesive layer with the front side of the semiconductor wafer facing the adhesive layer, which is sensitive to a certain exterior factor for reducing its adhesive force (wafer-and-support combining step); holding fixedly the wafer-and-support combination on the chuck table of a wafer grinding machine to grind the semiconductor wafer on the rear side until the grooves appear on the rear side of the semiconductor wafer (grinding step); applying the wafer-and-support combination to an adhesive tape for dicing with the so ground rear side facing the adhesive tape, which tape is surrounded and supported by the circumference by a dicing frame (taping step); and effecting the certain exterior factor on the intervening adhesive layer to reduce its adhesive force before or after the taping step, and removing the intervening adhesive layer and support disk from the front side of the semiconductor wafer after the taping step (tape-removing step).

Further, the present invention provides a method for dividing a semiconductor wafer into separate chips, said semiconductor wafer having a plurality of chips defined by crossing streets on its front side, characterized in that it comprises the steps of: holding fixedly the semiconductor wafer on a chuck table of a dicing machine to make grooves along the crossing streets on the front side of the semiconductor wafer (grooving step); applying the semiconductor wafer to a support disk via an intervening adhesive layer with the front side of the semiconductor wafer facing the adhesive layer, which is sensitive to a certain exterior factor for reducing its adhesive force (wafer-and-support combining step); holding fixedly the wafer-and-support combination on a selected chuck table of a wafer grinding machine to grind the semiconductor wafer on the rear side until the grooves appear on the rear side of the semiconductor wafer, thereby separating the semiconductor wafer into individual chips (dicing step); and effecting the certain exterior factor on the intervening adhesive layer to reduce its adhesive force, and removing the intervening adhesive layer and support disk from the semiconductor wafer (chips-separating step).

In each above invention, the wafer-and-support combining step may include the step of using a support disk larger than the semiconductor wafer; and the dicing step may include the step of putting two probes on the semiconductor wafer and the marginal portion of the support disk, thereby dicing the semiconductor wafer while measuring the remaining thickness of the semiconductor wafer. The intervening adhesive layer may include foaming ingredients sensitive to the exterior factor for producing foam in the adhesive layer. The intervening adhesive layer may be an adhesive tape having foaming ingredients included in at least one side, the foaming ingredients being sensitive to the light for foaming. The support disk may be of a transparent material. The support disk may be of a piece of glass 0.5 to 2.5 mm thick.

As may be understood from the above, a semiconductor wafer is applied to a support disk of good rigidity via an adhesive layer, which is sensitive to a certain exterior factor for reducing its adhesive force, and the so combined wafer-and-support is ground until the semiconductor wafer is reduced in thickness as required, and then it is exposed to the certain exterior factor, thereby permitting the semiconductor wafer to be removed from the support disk with ease. Thus, the thin semiconductor wafer can be separated without being broken or damaged.

In case of the pre-dicing method, thin semiconductor squares can be separated without difficulty.

To make sure of the easy separation of the semiconductor wafer or semiconductor chips from the support disk, use is made of an adhesive tape which is sensitive to the ultraviolet rays for not only reducing its adhesive force but also foaming inside to make and expand voids in the adhesive layer.

DETAILED DESCRIPTION OF THE INVENTION

Figure 1:
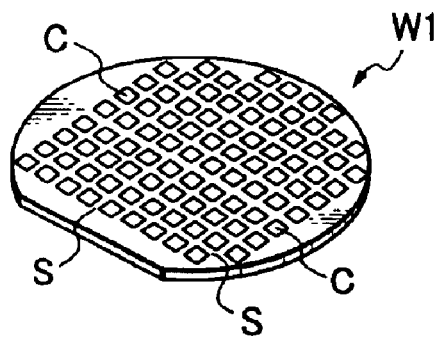
FIG. 1 is a perspective view of a semiconductor wafer.

Referring to FIG. 1, a semiconductor wafer W1 has a plurality of chips C defined by crossing streets S on its front side. The semiconductor wafer W1 is divided into squares C individually according to the dividing method of the present invention as follows.

Figure 2:
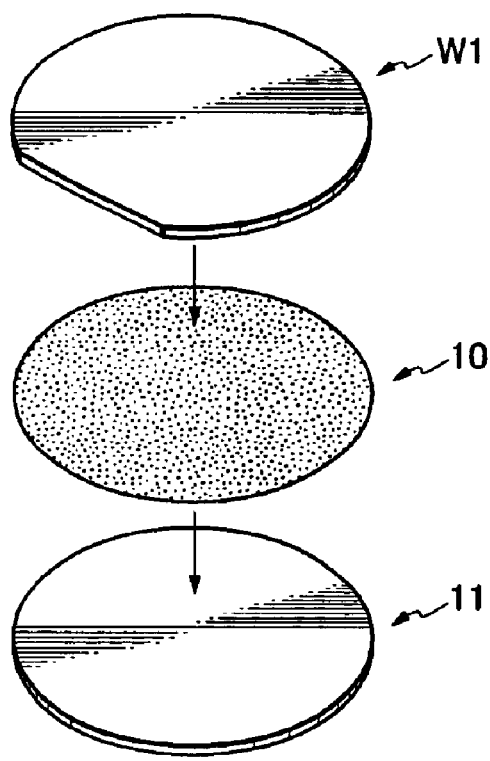
FIG. 2 is a series of perspective views of a semiconductor wafer, an intervening adhesive tape and a support disk, illustrating how these objects are combined.

Referring to FIG. 2, the semiconductor wafer W1 is turned upside down, and it is attached to a support disk 11 via an intervening adhesive tape 10, thus providing a wafer-and-support combination (wafer-and-support combining step).

The intervening adhesive tape 10 provides an adhesive layer for sticking the semiconductor wafer W1 to the support disk 11, and the adhesive layer is sensitive to a certain exterior factor for reducing its adhesive force. The adhesive force is caused by the adhesive force and void-less, close attaching force. Adhesive tapes described in JP 63-17981(A) and JP 4-88075(A) may be used.

Figure 4:
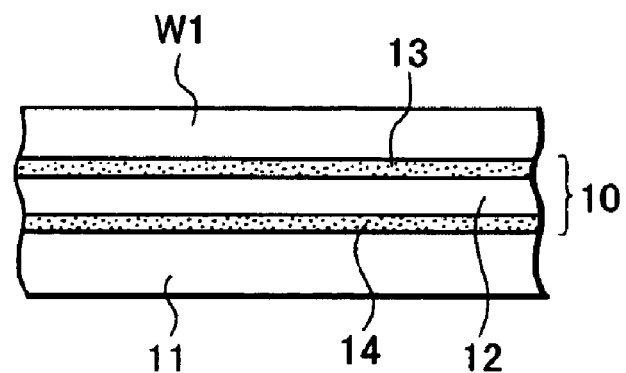
FIG. 4 is a side view of a fragment of the intervening adhesive tape.

Referring to FIG. 4, the adhesive tape 10 has its intervening film layer 12 coated on both sides with adhesive agents of different characteristics. Specifically, the intervening film layer 12 is a piece of polyethylene film 30 $\mu$m thick. It has, on one side, a 20 $\mu$m-thick coating 13 of a mixture of: acrylic adhesive agent; urethane acrylate oligomer (radioactive-polymeric compound); and ammonium carbonate or "Matsumoto Microsphere" available from Matsumoto Yushi-Seiyaku Co., Ltd (foaming agent). Also, it has, on the other side, a 20 $\mu$m-thick coating 14 of a mixture of acrylic adhesive agent and urethane acrylate oligomer. Foaming agent may be added to the adhesive layer 14 when occasion demands, but the amount of the foaming agent to be added to the adhesive layer 14 is smaller than that added to the adhesive layer 13.

Exposure of the adhesive tape to ultraviolet rays will cause the adhesive layer 13 to reduce its adhesive force and at the same time, its void-less, close attaching force; foaming voids appear in the thickness of the adhesive layer 13. On the other hand in the adhesive layer 14 the adhesive force lowers, but the void-less, close attaching force is kept unchanged because no foaming agent is included. As a matter of importance it should be noted that the semiconductor wafer W1 sticks to the adhesive layer 13, and that the support disk 11 sticks to the adhesive layer 14 as shown in FIG. 4. In this particular embodiment the intervening adhesive tape is described as comprising adhesive layers 13 and 14 both sensitive to the exterior factor for reducing their adhesive force, but it should be noted that: as for the adhesive layer 14 it may be insensitive to the exterior factor for reducing its adhesive force, not requiring exposure to the exterior factor.

The support disk 11 has to be rigid enough to support the overlying semiconductor wafer, which is ground to be 100 or less $\mu$m thick or 50 or less $\mu$m thick, and is made of PET or glass penetrating ultraviolet rays. For example it is a piece of transparent glass 0.5 to 2.5 mm thick.

Figure 3:
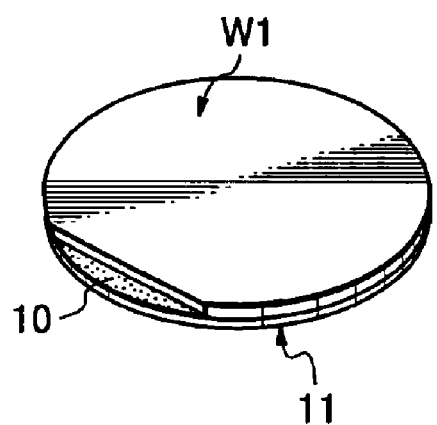
FIG. 3 is a perspective view of the wafer-tape-support combination.
Figure 5:
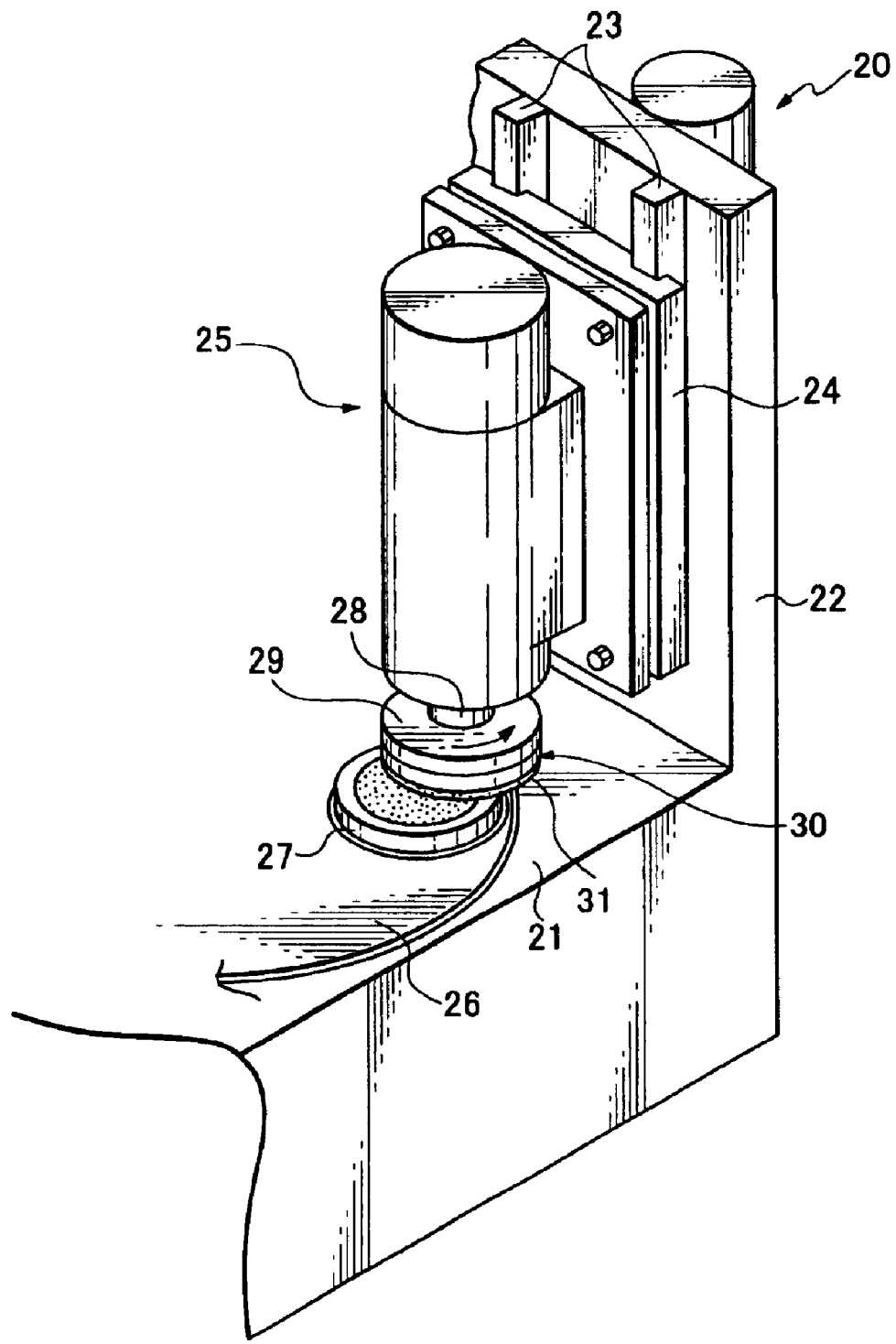
FIG. 5 is a perspective view of a grinding machine.

The semiconductor wafer W1 held with the support disk 11 via the adhesive tape 10 as seen in FIG. 3 is transported to a grinding machine 20 as shown in FIG. 5, where it is ground on the rear side until a required thickness is reached (grinding step).

As shown in the drawing, the grinding machine 20 has an upright wall 22 standing on the base 21 of the machine 20, a vertically movable support 24 rides on parallel rails 23 laid on the upright wall 22, and a grinding unit 25 mounted to the support 24 movably up and down together with the support 24. A turntable 26 is arranged rotatably on the base 21, and it has a plurality of chuck tables 27 rotatably arranged thereon.

The grinding unit 25 has a spindle 28 rotatable about its vertical center axis, and the spindle 28 has a mount 29 fixed to its end. The mount 29 has a grinding wheel 30 on its bottom. A grinding stone 31 is fastened to the grinding wheel 30, which can rotate along with the spindle 28.

In grinding the semiconductor wafer W1 with the grinding machine 20, a selected wafer-and-support combination is sucked and fixedly held on a selected chuck table 27 to bring the wafer-and-support combination under the grinding unit 25. Then, the spindle 28 is rotated and the grinding unit 25 is lowered. The spindle 28 and hence the grinding wheel 30 rotates at a high speed, and the grinding stone 31 is pushed against the semiconductor wafer W1 to grind away its surface.

Figure 6:
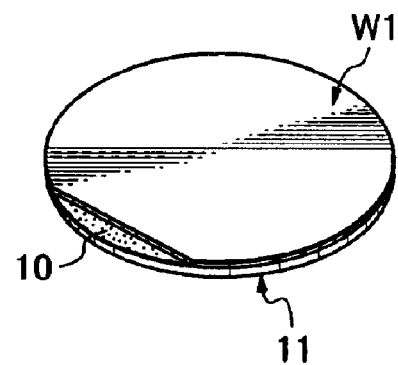
FIG. 6 is a perspective view of the post-grinding wafer-tape-support combination.
Figure 7:
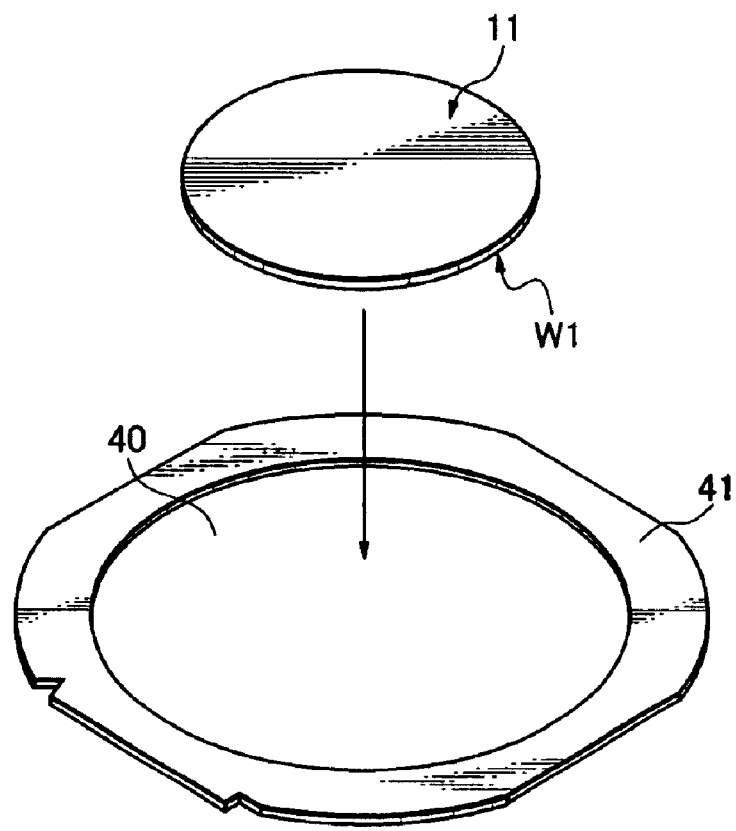
FIG. 7 is a perspective view of the wafer-tape-support combination and an adhesive tape-and-frame for dicing, illustrating how the combination is applied to the adhesive tape for dicing.

Thus, the wafer-and-support combination has its semiconductor wafer W1 reduced in thickness as seen from FIG. 6, and the wafer-and-support combination is turned upside down to be laid on a dicing adhesive tape 40.

A dicing frame 41 is attached to the circumference of the dicing adhesive tape 40, and the wafer-and-support combination is put on the adhesive tape 40 with the rear side of the semiconductor wafer W1 down (taping step).

Figure 8:
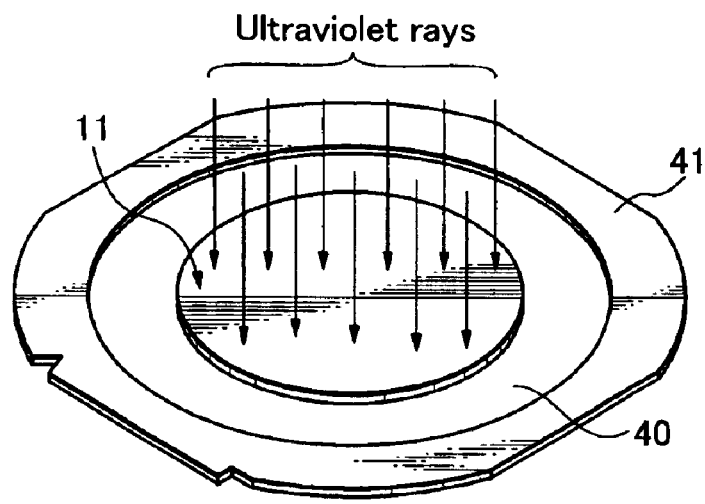
FIG. 8 illustrates how the support disk is exposed to ultraviolet rays.
Figure 9:
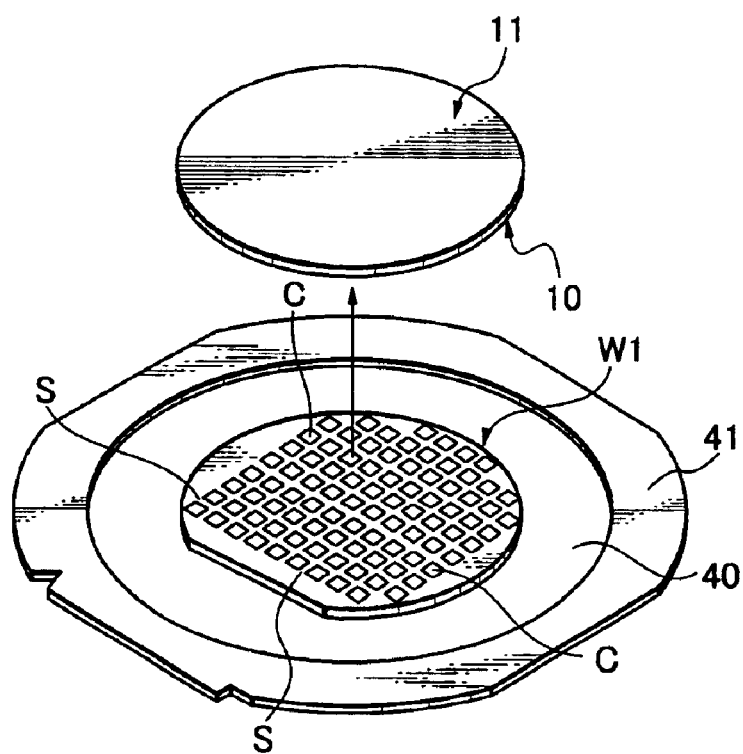
FIG. 9 illustrates how the support disk is removed from the semiconductor wafer.

Next, a certain exterior factor is effected on the intervening adhesive tape 10 via the support disk 11. Specifically ultraviolet rays are thrown onto the support disk 11, as seen from FIG. 8. Then, the adhesive layer 13 reduces its adhesive force, and at the same time, voids appear between the adhesive layer 13 and the semiconductor wafer W1 owing to foaming, making it easy to remove the adhesive tape 10 from the semiconductor wafer W1.

On the other hand, the opposite adhesive layer 14 still holds its adhesive force, thus allowing the adhesive tape 10 and the support disk 11 to be removed from the semiconductor wafer W1 as a whole.

Namely, after the adhesive force of the adhesive tape 10 is reduced, the support disk 11 is held up to be detached from the surface of the semiconductor wafer W1. At this time, adhesive force of the adhesive layer 13 on the adhesive tape 10 is weaker than that of the adhesive layer 14 and accordingly the adhesive tape 10 is detached from the semiconductor wafer W1 together with the support disk 11.

Meanwhile, the adhesive tape 10 holds fixedly the support disk 11 on its adhesive layer 14, and therefore, the thin semiconductor wafer W1 is left alone on the dicing adhesive tape 40 and dicing frame 41 (tape-removing step).

Thus, after the adhesive force is reduced by exposing to the exterior factor, the support disk 11 is removed, letting the thin semiconductor wafer W1 transfer to the dicing adhesive tape without the fear of damaging.

It should be noted that exposure of the adhesive tape 10 to the exterior factor may be performed prior to the tape-removing step. In that case the adhesive layer 13 is lowered in its adhesive force, but still strong enough to prevent the support disk 11 from departing from the semiconductor wafer W1. Therefore, no inconvenience is caused in the tape-removing step.

Figure 10:
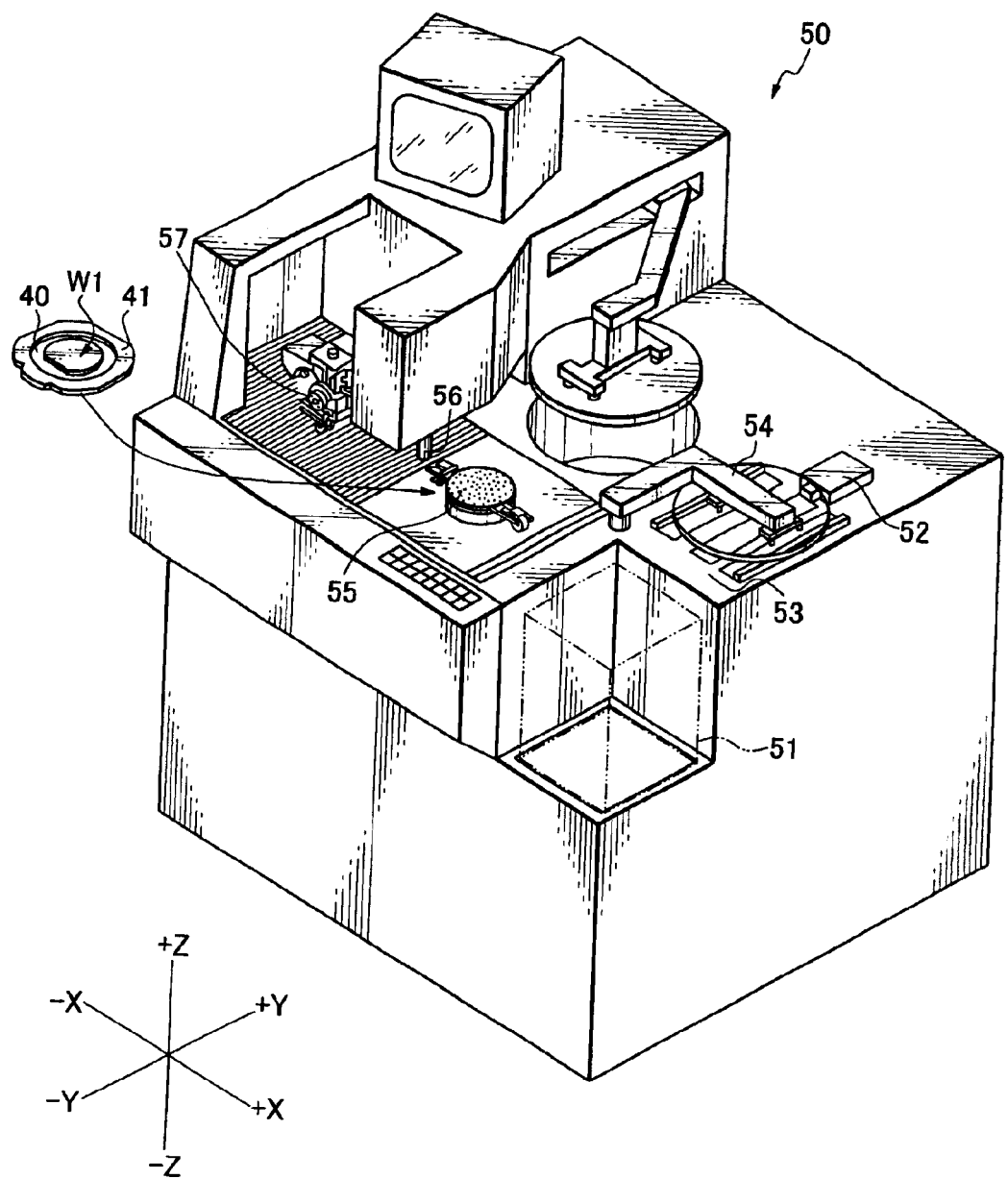
FIG. 10 is a perspective view of a dicing machine for use in dicing semiconductor wafers.

The semiconductor wafer W1 thus attached to the dicing frame 41 via the dicing adhesive tape 40 is ready for dicing in the dicing machine 50 as shown in FIG. 10.

A plurality of the semiconductor wafers W1 attached to the dicing frame 41 via the dicing adhesive tape 40 are contained in a cassette 51 in the dicing machine 50.

The semiconductor wafer W1 attached to the dicing frame is transferred to the tentative storage area 53 one by one by the carrier means 52 in the dicing machine 50. The first transporting means 54 sucks the wafer-and-frame combination to rotate and release it on the chuck table 55, where it is fixedly held by suction.

Then, the chuck table 55 moves in the +x-direction to put the wafer-and-frame combination right below the alignment means 56, where one of the streets is selected to be cut by using the pattern matching method, and the so selected street S is aligned with the rotary blade 57 laterally in respect of the Y-axis. Then, the chuck table 55 is moved in the x-axis direction, letting the rotary blade 57 cut the selected street on the semiconductor wafer W1.

Figure 11:
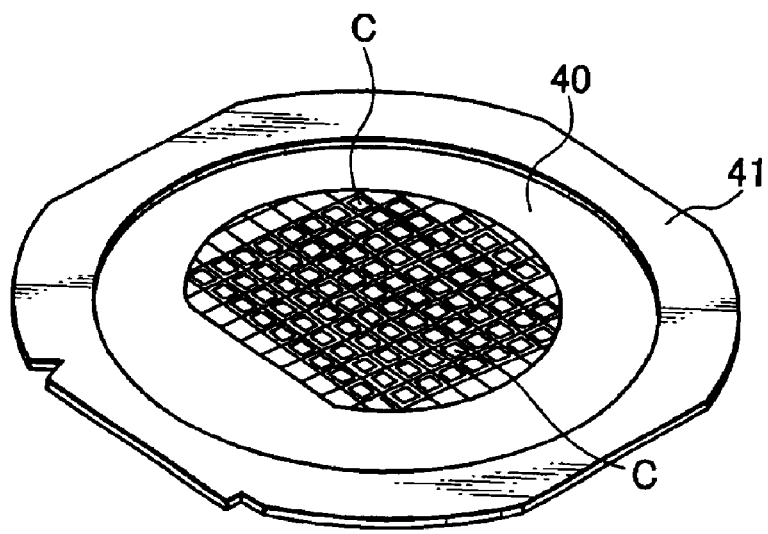
FIG. 11 is a perspective view of the post-dicing semiconductor wafer.

This is repeated every time the rotary blade 57 is indexed the street-to-street distance in the y-axis direction. After cutting all streets in one of the orthogonal directions the chuck table 55 is rotated 90 degrees to effect same cuttings in the other orthogonal direction, so that the semiconductor wafer W1 may be cut crosswise into squares C as shown in FIG. 11 (dicing step).

Thus, no matter how the semiconductor wafer W1 may be reduced in thickness like paper, semiconductor chips can be manufactured without being broken.

To facilitate separation of the semiconductor wafer or chips from the support disk, use is made of an adhesive tape whose adhesive layer is sensitive to ultraviolet rays for not only lowering its adhesive force but also causing appearance of voids owing to foaming between the wafer and the support disk.

Now, the pre-dicing method is described.

Figure 12:
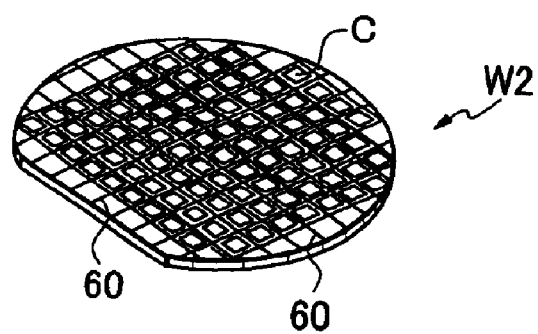
FIG. 12 is a perspective view of a semiconductor wafer having grooves made on its front side.
Figure 13:
FIG. 13 is a side view of a fragment of the semiconductor wafer having grooves made on its front side.

First, a selected semiconductor wafer W2 is put on the chuck table 55 in the dicing machine 50 of FIG. 10. The grooves 60 are made on the semiconductor wafer W2 by the rotary blade 57 as shown in FIGS. 12 and 13. These crosswise grooves 60 have their depth equal to the thickness of the finished chips C (grooving step).

Figure 14:
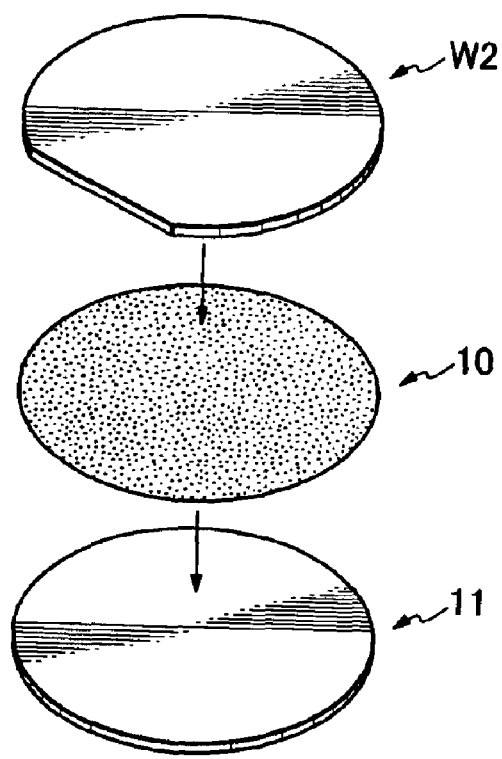
FIG. 14 illustrates how the grooved semiconductor wafer is applied to a support disk via an intervening adhesive tape.
Figure 15:
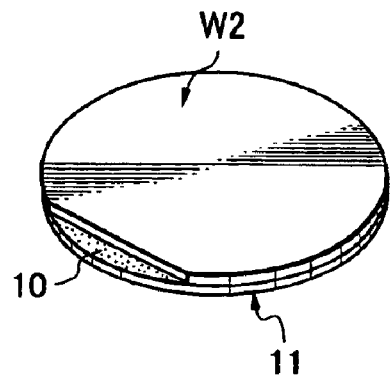
FIG. 15 is a perspective view of the wafer-tape-support combination.

The grooved semiconductor wafer W2 is turned upside down to be applied to a support disk 11 via an intervening adhesive tape 10 as shown in FIG. 14 like FIG. 2, thus providing a wafer-and-support combination as shown in FIG. 15 (wafer-and-support combining step).

Figure 16:
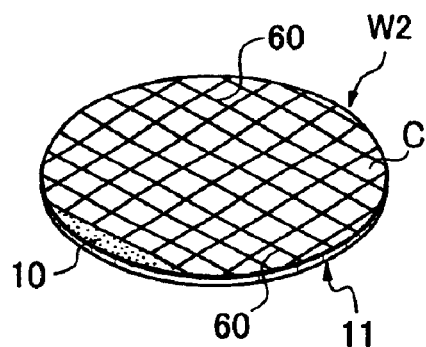
FIG. 16 is a perspective view of the wafer-tape-support combination, the wafer being ground on the rear side to allow its grooves to appear.
Figure 17:
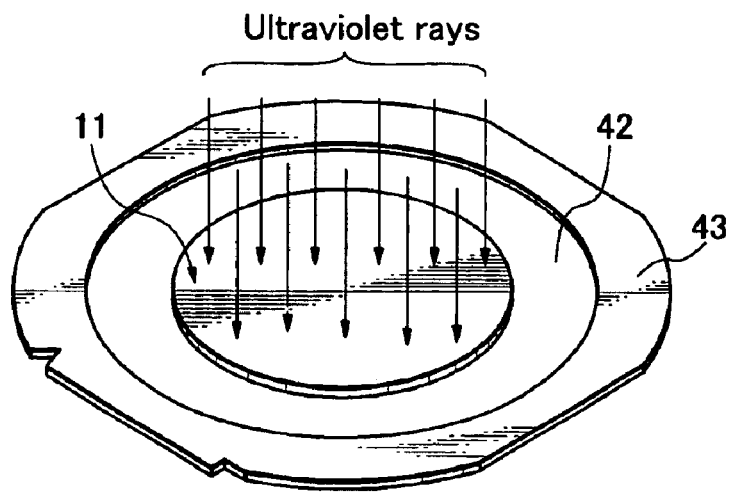
FIG. 17 illustrates how the support disk is exposed to ultraviolet rays.

The semiconductor wafer W2 combined with the support disk 11 is fixedly held on a selected chuck table 27 of the grinding machine 20 (see FIG. 5), and the grinding unit 25 is used to grind the semiconductor wafer W2 on the rear side until the crosswise grooves 60 appear as seen from FIG. 16 (grinding step).

In order to permit the pickup means to pick up the semiconductor chips C, first, the grooved semiconductor wafer W2 is put on a framed adhesive tape 42 with the groove-appearing surface (rear side) down (taping step). Then, ultraviolet rays are thrown onto the support disk 11 to reduce the adhesive force of the adhesive layer 13 of the tape 10.

Figure 18:
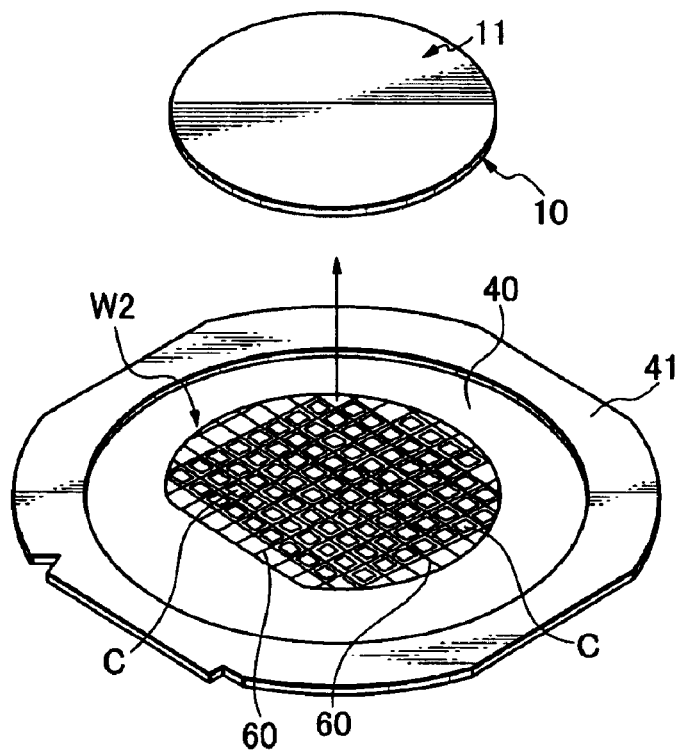
FIG. 18 illustrates how the support disk is removed from the semiconductor wafer.

Then, the support disk 11 is raised to leave the semiconductor wafer W2 behind, as seen from FIG. 18. The lower adhesive layer 13 has its adhesive force weaker than the dicing adhesive tape 40, thus allowing the intervening adhesive tape 10 along with the support disk 11 to leave the semiconductor wafer W2.

The upper adhesive layer 14 of the intervening tape 10 is still strong enough to hold fixedly the support disk 11. Thus, the thin semiconductor wafer W2 remains to be held fixedly by the dicing adhesive tape 40 and associated frame 41 (tape-removing step).

The adhesive force is reduced by the exterior factor before removing the support disk 11, thereby permitting removal of the thin semiconductor wafer W2 without being broken.

Forming voids between the semiconductor wafer W2 and the support disk releases the close attaching force, thereby facilitating removal thereof.

It should be noted that exposure of the adhesive tape 10 to the exterior factor may be performed prior to the tape-removing step. In that case the adhesive layer 13 is lowered in its adhesive force, but still strong enough to prevent the support disk 11 from departing from the semiconductor wafer W2. Thus, no inconvenience is caused in the tape-removing step.

Figure 19:
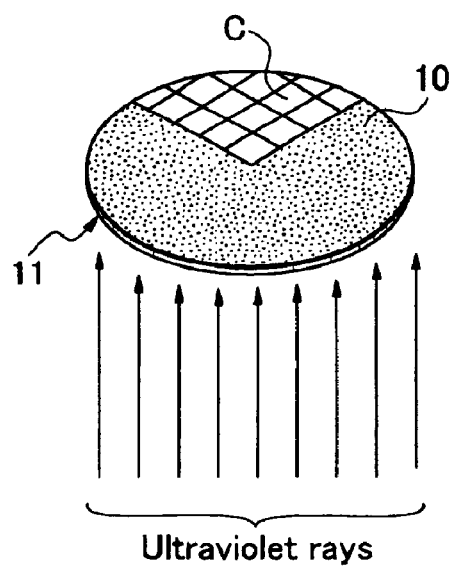
FIG. 19 illustrates how the support disk is exposed to ultraviolet rays to remove the squares from the intervening adhesive layer.

All separate semiconductor chips C remain in the circular lattice form of the prior-dicing semiconductor wafer, sticking to the adhesive tape 10, via which the squares are supported by the support disk 11. Then, the adhesive tape 10 is exposed to ultraviolet rays via the support disk 11, as shown in FIG. 19. Thus, the adhesive force is lowered so that the semiconductor chips C may be readily picked up from the support disk 11. As may be realized, the tape-removing step can be omitted, and accordingly the working efficiency can be improved. Also, no dicing tape 40 and frame 41 are required, and accordingly the manufacturing cost can be reduced (chips-separating step).

In grinding semiconductor wafers W1 or W2 it is necessary that the required grinding be performed while measuring the instantaneous thickness of the wafer to determine when the final desired thickness is reached, and when the cutting is made to stop.

Figure 20:
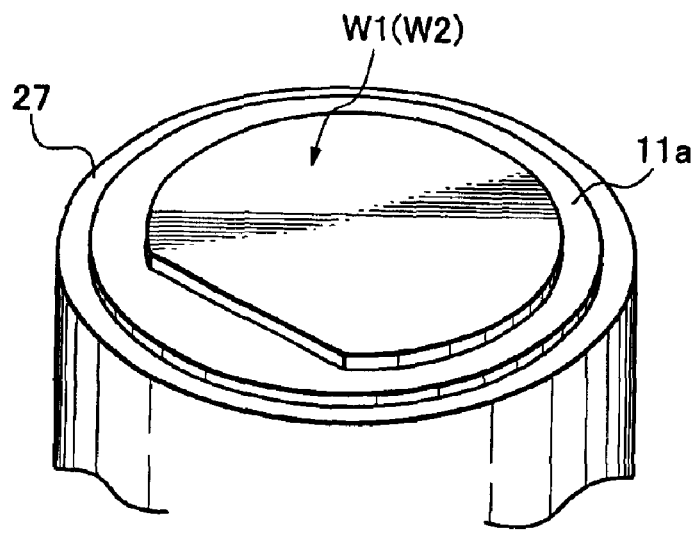
FIG. 20 illustrates how a semiconductor wafer is supported by a support disk, which is larger than the semiconductor wafer.
Figure 21:
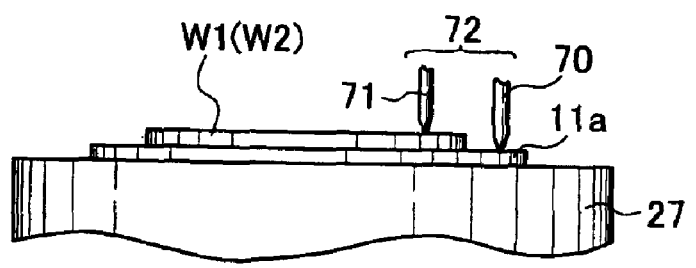
FIG. 21 illustrates how the semiconductor wafer on the support disk can be measured in thickness with the aid of a thickness gauge.

Referring to FIG. 20, a support disk 11a is made larger than the semiconductor wafer W1 (W2), and the semiconductor wafer W1 (W2) combined with the support disk 11a is fixedly held on a selected chuck table 27 of the grinding machine 20 of FIG. 5. Referring to FIG. 21, one probe 70 is put in contact with the marginal surface of the support disk 11a, and at the same time, another probe 71 is put in contact with the rear surface of the semiconductor wafer W1 (W2).

Thus, the probes 70 and 71 make up a thickness gauge 72, measuring the thickness of the semiconductor wafer W1 (W2) in respect of the difference between the heights of these probes. Making the support disk 11a larger than the semiconductor wafer W1 (W2) enables measurement of the thickness of the semiconductor wafer W1 (W2) whenever necessary as above, and accordingly the grinding step is accomplished measuring the thickness of the semiconductor wafer W1 (W2) and thickness of the final semiconductor chips can be controlled exactly.

Preferably the support disk 11 is 1 to 2 mm larger in diameter than the semiconductor wafer, thereby preventing the semiconductor wafers from being hit by the inner wall of the cassette 51 as seen from FIG. 10, and hence from being damaged in putting in the cassette 51.

In the above description dicing or grooving is effected by the rotary blade, but such machining of dividing into semiconductor chips or grooving can be effected equally by using laser beams. The present invention can be equally carried out by a dicing machine using a rotary blade or a laser.

INDUSTRIAL APPLICABILITY

As described above, the method for manufacturing semiconductor chips according to the present invention is made to grind a semiconductor wafer by applying the semiconductor wafer to a support disk via an intervening adhesive layer which is sensitive to a certain exterior factor for reducing its adhesive force. Advantageously, removal of the semiconductor wafer or chips can be performed without being damaged. The method, therefore, is very useful in producing all semiconductor chips, especially in producing thin semiconductor chips.

What is claimed is,:

1. A method for dividing a semiconductor wafer into separate chips, said semiconductor wafer having a plurality of chips defined by crossing streets on its front side, said method comprising:

applying the semiconductor wafer to a support disk via an intervening adhesive layer with the front side of the semiconductor wafer facing the adhesive layer, which is sensitive to a certain exterior factor for reducing its adhesive force, thereby performing a wafer and support disk combining step;

holding fixedly the wafer-and-support disk combination on a selected chuck table of a wafer grinding machine to grind the semiconductor wafer on the rear side, thereby performing a grinding step;

applying the wafer-and-support disk combination to an adhesive tape for dicing with the so ground rear side facing the adhesive tape, which tape is surrounded and supported by the circumference by a dicing frame, thereby performing a taping step;

effecting the certain exterior factor on the intervening adhesive layer to reduce its adhesive force before or after the taping step, and removing the intervening adhesive layer and support disk from the front side of the semiconductor wafer after the taping step, thereby performing a tape-removing step; and holding the wafer-and-frame combination on the chuck table of a dicing machine to cut and separate the semiconductor wafer into individual chips, thereby performing a dicing step;

wherein the wafer-and-support disk combining step includes using, a support disk larger than the semiconductor wafer, and the grinding step includes putting two probes on the semiconductor wafer and the marginal portion of the support disk, thereby grinding the semiconductor wafer while measuring the remaining thickness of the semiconductor wafer.

2. A method for dividing a semiconductor wafer into separate chips according to claim 1, wherein the intervening adhesive layer has foaming ingredients sensitive to the exterior factor for producing foam.

3. A method for dividing a semiconductor wafer into separate chips according to claim 2, wherein the intervening adhesive layer has foaming ingredients included in at least one side, the foaming ingredients being sensitive to the light for producing foam.

4. A method for dividing a semiconductor wafer into separate chips according to claim 3, wherein the support disk is of a transparent material.

5. A method for dividing a semiconductor wafer into separate chips according to claim 4, wherein the support disk is of a piece of glass 0.5 to 2.5 mm thick.

6. A method for dividing a semiconductor wafer into separate chips, said semiconductor wafer having a plurality of chips defined by crossing streets on its front side, said method comprising:

holding the semiconductor wafer on a chuck table of a dicing machine to make grooves along the crossing streets on the front side of the semiconductor wafer, thereby performing a grooving step;

applying the semiconductor wafer to a support disk via an intervening adhesive layer with the front side of the semiconductor wafer facing the adhesive layer, which is sensitive to a certain exterior factor for reducing its adhesive force, thereby performing a wafer-and-support combining step;

holding fixedly the wafer-and-support disk combination on the chuck table of a wafer grinding machine to grind the semiconductor wafer on the rear side until the grooves appear on the rear side of the semiconductor wafer, thereby perfomiing a;

applying the wafer-and-support disk combination to an adhesive tape for dicing with the so ground rear side facing the adhesive tape, which tape is surrounded and supported by the circumference by a dicing frame, thereby performing a taping step; and effecting the certain exterior factor on the intervening adhesive layer to reduce its adhesive force before or after the taping step, and removing the intervening adhesive layer and support disk from the front side of the semiconductor wafer after the taping step, thereby performing a tape-removing step;

wherein the wafer-and-support disk combining step includes using, a support disk larger than the semiconductor wafer; and the grinding step includes putting two probes on the semiconductor wafer and the marginal portion of the support disk, thereby grinding the semiconductor wafer while measuring the remaining thickness of the semiconductor wafer.

7. A method for dividing a semiconductor wafer into separate chips according to claim 6, wherein the intervening adhesive layer has foaming ingredients sensitive to the exterior factor for producing foam.

8. A method for dividing a semiconductor wafer into separate chips according to claim 7, wherein the intervening adhesive layer has foaming ingredients included in at least one side, the foaming ingredients being sensitive to the light for producing foam.

9. A method for dividing a semiconductor wafer into separate chips according to claim 8, wherein the support disk is of a transparent material.

10. A method for dividing a semiconductor wafer into separate chips according to claim 9, wherein the support disk is of a piece of glass 0.5 to 2.5 mm thick.

11. A method for dividing a semiconductor wafer into separate chips, said semiconductor wafer having a plurality of chips defined by crossing streets on its front side, said method comprising:

holding fixedly the semiconductor wafer on a chuck table of a dicing machine to make grooves along the crossing streets on the front side of the semiconductor wafer, thereby performing a grooving step;

applying the semiconductor wafer to a support disk via an intervening adhesive layer with the front side of the semiconductor wafer facing the adhesive layer, which is sensitive to a certain exterior factor for reducing its adhesive force, thereby performing a wafer-and-support disk combining step;

holding fixedly the wafer-and-support disk combination on a selected chuck table of a wafer grinding machine to grind the semiconductor wafer on the rear side until the grooves appear on the rear side of the semiconductor wafer, thereby separating the semiconductor wafer into individual chips, thereby performing a grinding step; and effecting the certain exterior factor on the intervening adhesive layer to reduce its adhesive force, and removing the intervening adhesive layer and support disk from the semiconductor wafer, thereby performing a chip-separating step;

wherein the wafer-and-support disk combining step includes using a support disk larger than the semiconductor wafer; and the grinding step includes putting two probes on the semiconductor wafer and the marginal portion of the support disk, thereby grinding the semiconductor wafer while measuring the remaining thickness of the semiconductor wafer.

12. A method for dividing a semiconductor wafer into separate chips according to claim 11, wherein the intervening adhesive layer has foaming ingredients sensitive to the exterior factor for producing foam.

13. A method for dividing a semiconductor wafer into separate chips according to claim 12, wherein the intervening adhesive layer has foaming ingredients including in at least one side, the foaming ingredients being sensitive to the light for producing foam.

14. A method for dividing a semiconductor wafer into separate chips according to claim 13, wherein the support disk is of a transparent material.

15. A method for dividing a semiconductor wafer into separate chips according to claim 14, wherein the support disk is of a piece of glass 0.5 to 2.5 mm thick.

* * * * *